United States Patent
Heid

(10) Patent No.: US 7,126,334 B2
(45) Date of Patent: Oct. 24, 2006

(54) GENERATOR FOR GENERATING TIME-VARIABLE MAGNETIC FIELDS AND MAGNETIC RESONANCE DEVICE

(75) Inventor: Oliver Heid, Gunzenhausen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/959,772

(22) Filed: Oct. 6, 2004

(65) Prior Publication Data
US 2005/0073312 A1 Apr. 7, 2005

(30) Foreign Application Priority Data
Oct. 6, 2003 (DE) .................. 103 46 275

(51) Int. Cl.
*G01V 3/00* (2006.01)
(52) U.S. Cl. ...................... 324/318; 324/319
(58) Field of Classification Search ................. 324/318, 324/319, 322, 309, 307, 300; 600/410; 335/299
See application file for complete search history.

(56) References Cited

U.S. PATENT DOCUMENTS

| | | | |
|---|---|---|---|
| 4,829,252 A | | 5/1989 | Kaufman |
| 5,036,282 A | * | 7/1991 | Morich et al. ............... 324/318 |
| 5,539,314 A | * | 7/1996 | Arakawa et al. ............. 324/318 |
| 6,157,279 A | * | 12/2000 | Laskaris et al. ............. 335/299 |
| 6,433,550 B1 | | 8/2002 | Kinanen |
| 2005/0083056 A1 | | 4/2005 | Harvey et al. |

FOREIGN PATENT DOCUMENTS

| | | |
|---|---|---|
| DE | 40 37 894 A1 | 6/1991 |
| DE | 42 32 884 A1 | 3/1994 |
| DE | 44 22 781 C1 | 2/1996 |
| DE | 199 63 184 A1 | 7/2001 |
| EP | 0 404 461 A1 | 12/1990 |
| WO | WO 03/054569 A1 | 7/2003 |

\* cited by examiner

*Primary Examiner*—Brij B. Shrivastav

(57) ABSTRACT

A generator of time-variable magnetic fields of a magnetic resonance apparatus, said apparatus having an examination space for imaging of at least one area of an examination subject to be examined, incorporates the following features:
 the conductors of a gradient coil arrangement of the generator extent over an essentially disk-shaped area,
 the area includes at least one sub-area which is free from conductors of the gradient coil arrangement and within which are arranged conductors of a high-frequency antenna of the generator, and
 a field backflow space, which is available inter alia for fields of the high-frequency antenna, extends away from the examination space, starting from the sub-area.

16 Claims, 3 Drawing Sheets

GENERATOR FOR GENERATING TIME-VARIABLE MAGNETIC FIELDS AND MAGNETIC RESONANCE DEVICE

CROSS REFERENCE TO RELATED APPLICATIONS

This application claims priority to the German application No. 10346275.9, filed Oct. 6, 2003 and which is incorporated by reference herein in its entirety.

FIELD OF INVENTION

The invention relates to a generator of time-variable magnetic fields of a magnetic resonance apparatus and a magnetic resonance apparatus with the generator.

BACKGROUND OF INVENTION

Magnetic resonance technology is a known technology, the objectives of which include obtaining images of the interior of the examination subject's body. Thus in a magnetic resonance apparatus, rapidly switched magnetic gradient fields that are generated by a gradient coil system are superimposed on a static basic magnetic field which is generated by a basic field magnet. The magnetic resonance apparatus also includes a high-frequency antenna, which beams high-frequency signals into the examination subject in order to trigger magnetic resonance signals, and picks up the triggered magnetic resonance signals on the basis of which magnetic resonance images are produced.

SUMMARY OF INVENTION

For example, U.S. Pat. No. 6,433,550 discloses an open magnetic resonance apparatus with a C-shaped basic field magnet, said magnetic resonance apparatus incorporating a pole plate at each of the two ends of the C-structure on both sides of a patient imaging space of the magnetic resonance apparatus, said patient imaging space being arranged in the aperture of the C-structure, and between which pole plates the basic magnetic field of the magnetic resonance apparatus can be generated, at least inside the patient imaging space. Furthermore, components of a gradient coil system are arranged on each of the pole plates facing toward the patient imaging space, said components being essentially of planar construction and on which are then arranged components of an antenna system of the magnetic resonance apparatus, such components likewise being of planar construction. Gradient coils for the aforementioned gradient coil system are described in greater detail in DE 40 37 894 A1 and DE 44 22 781 C1, for example. Further designs of basic field magnets of magnetic resonance apparatuses in which the aforementioned components of a gradient coil system and antenna system are used, said components being of essentially planar construction, are described in DE 199 63 184 A1 and U.S. Pat. No. 4,829,252, for example.

DE 42 32 884 A1 further discloses, in a magnetic resonance apparatus with a basic field magnet having pole plates, the arrangement of a high-frequency shield, which can be implemented with slots bridged with capacitors, between the gradient coil system and antenna system which are mounted on the pole plates and are of essentially planar construction. DE 42 32 884 A1 also discloses that basic field magnets having pole plates are used in an attempt to keep the pole plate spacing as small as possible, so that the weight of the basic field magnet remains low and a better homogeneity of the basic magnetic field can be achieved. Any components installed between the pole plates, for example the gradient coil system, the high-frequency shield and the antenna system, must therefore also be kept as flat as possible. On the other hand, to ensure that the antenna system works efficiently—particularly if the latter is being used as a reception antenna for magnetic resonance signals—the distance between the antenna system and the high-frequency shield should be as great as possible.

One object of the invention is to create a generator of time-variable magnetic fields of a magnetic resonance apparatus and a magnetic resonance apparatus with the generator, so that the generator is as compact as possible whilst remaining highly efficient.

This objects are achieved by the claims. Advantageous embodiments are described in the dependent claims.

Conventional solutions already require sufficient space to be provided between the gradient coils of a gradient coil system that is not actively shielded and the basic field magnet, or between the gradient coils and the corresponding shielding coils of an actively shielded gradient coil system, in order to enclose field lines of the gradient fields that can be generated with the gradient coils. According to the invention, this space—which, until now, has not been available for a backflow of a high-frequency field that can be picked up with the high-frequency antenna—is opened up, and therefore—so to speak—fulfils a dual role, so that the combination of gradient coil system and high-frequency antenna can be of a flatter construction compared to comparable conventional solutions with similar efficiency. The distance between the gradient coil system and the high-frequency antenna, for example as described in DE 42 32 884 A1 cited at the start, is thereby reduced. Thus in a first case, with an unmodified patient imaging space of a magnetic resonance apparatus, the basic field magnet of said magnetic resonance apparatus can be of a smaller size and is therefore significantly more cost-effective. In a second case, with an unmodified basic field magnet, a larger patient imaging space is achieved, the benefits of which include greater patient comfort.

BRIEF DESCRIPTION OF THE DRAWINGS

Other advantages, features and details of the invention are contained in the exemplary embodiments of the invention described below, with the help of diagrams. In these.

DETAILED DESCRIPTION OF INVENTION

Figure 1:
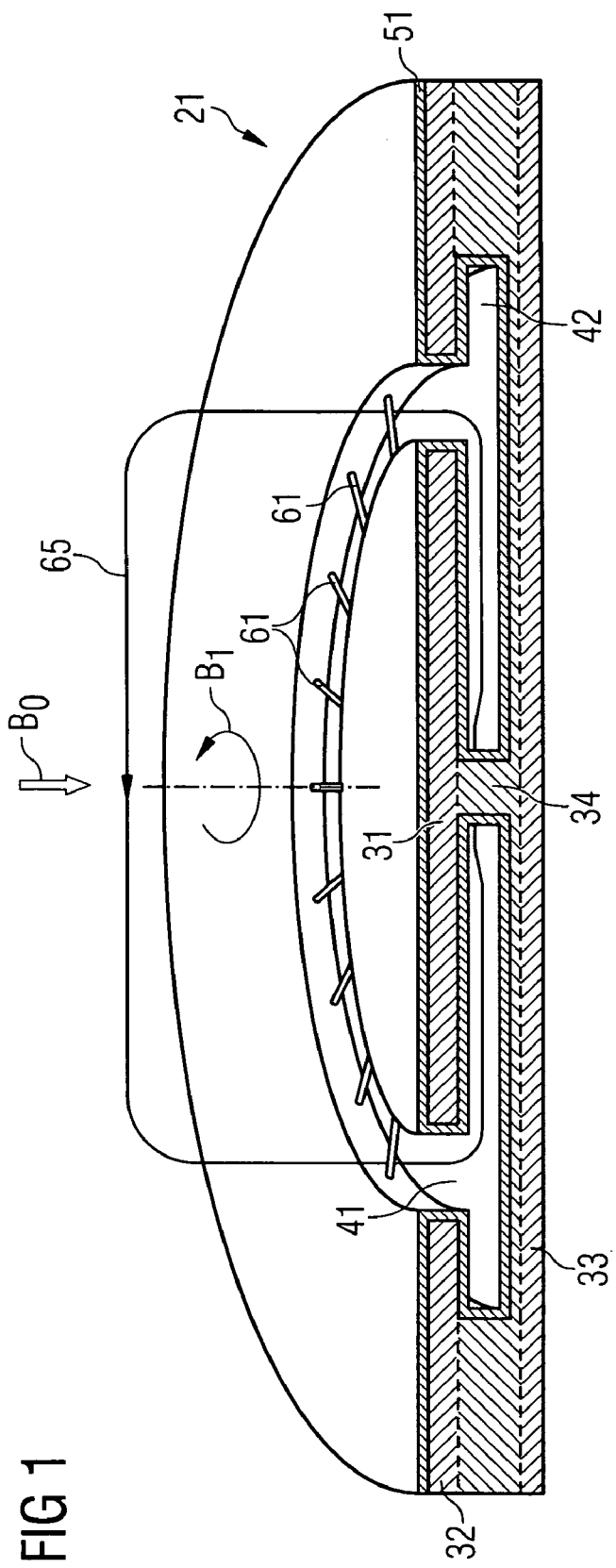
FIG. 1 shows one half of a generator of time-variable magnetic fields of a magnetic resonance apparatus with a field backflow space.

FIG. 1 shows, as an exemplary embodiment of the invention, an approximately centric longitudinal section through one half 21, shown in perspective, of a generator of time-variable magnetic fields of a magnetic resonance apparatus, said generator comprising two disk-shaped halves, whereby the illustrated half 21 is mounted—by way of example—on a lower pole plate of a C-shaped basic field magnet of the magnetic resonance apparatus, said basic field magnet generating a basic magnetic field $B_0$, and the other half is mounted on an upper pole plate. The illustrated half 21 comprises a disk-shaped area 31 and a ring-shaped area 32, in which are arranged electrical conductors of gradient coils of the generator. A ring-shaped free space 41 extends between the disk-shaped area 31 and the ring-shaped area 32. This free space functions as the aperture for an underlying ring-shaped field backflow space 42, which forms an undercut with regard to the ring-shaped free space 41.

Furthermore, one of the fixing sides of the half 21 on the surface of the half 21 that is positioned opposite the basic field magnet, is formed from a high-frequency shield 51, which—in a known manner, for example—comprises several layers of an electrically conductive foil and is constructed with slots bridged with capacitors. The ring-shaped free space 41 is bridged with resonator rods 61 in order to form a high-frequency antenna of the magnetic resonance apparatus. These resonator rods 61 incorporate—for example—longitudinal capacitors (not illustrated) in order to match a resonance frequency. Thus a component of the high-frequency shield 51 also forms part of the current paths of the high-frequency antenna. Thus a high-frequency field $B_1$ rotating around one direction of the basic magnetic field $B_0$ can be generated, and magnetic resonance signals can be captured, with the high-frequency antenna.

By way of example, a field line 65 of the high-frequency field $B_1$ is illustrated for a point in time, said field line being enclosed within the field backflow space 42, through the ring-shaped free space 41. The field backflow space 42 thus fulfils a dual purpose, so to speak, since it permits the field lines of the high-frequency field $B_1$ as well as the field lines of the gradient fields generated by the gradient coils to be enclosed within it.

The half 21 further incorporates a disk-shaped area 33, in which are arranged conductors of the shielding coils belonging to the gradient coils. The remaining area of the half 21 is available inter alia for accommodating components of a shim system and/or of a cooling system of the generator. In particular, a stem-shaped area 34 of the remaining area is used to carry supply lines to the conductors of the gradient coils, said conductors being arranged in the disk-shaped area 31, and also to components of the cooling system arranged therein, without the need for high-frequency ducts.

An upper half of the generator, which can be mounted on the upper pole plate, is constructed as an equivalent mirror-image with regard to the lower half 21 illustrated.

Figure 2:
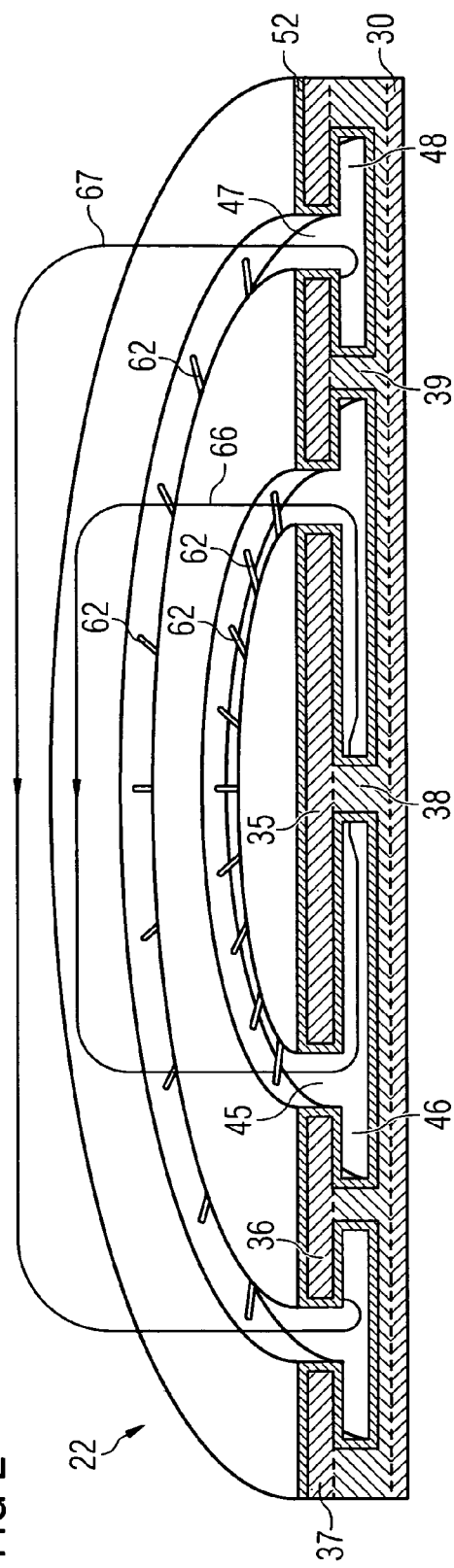
FIG. 2 shows one half of a generator of time-variable magnetic fields of a magnetic resonance apparatus with two field backflow spaces.

FIG. 2 shows, as a further exemplary embodiment of the invention, an approximately centric longitudinal section through one half 22, shown in perspective, of a generator of time-variable magnetic fields of a magnetic resonance apparatus, said generator comprising two disk-shaped halves. The main difference between this half 22 of the generator, and the half 21 of the generator shown in FIG. 1, is that this half 22 has two field backflow spaces 46 and 48, which are separate from one another. The illustrated half 22 thus comprises a disk-shaped area 35 and two ring-shaped areas 36 and 37, which contain electrical conductors of gradient coils of the generator. Two ring-shaped free spaces 45 and 47 extend between the aforementioned areas 35, 36 and 37. These free spaces function as apertures for the underlying ring-shaped field backflow spaces 46 and 48, said field backflow spaces being structurally separate from one another and forming an undercut with regard to the relevant aperture. The half 22 also incorporates a high-frequency shield 52. The ring-shaped free spaces 45 and 47 are bridged with resonator rods 62 in order to form a high-frequency antenna. By way of example, field lines 66 and 67 of a high-frequency field that can be generated with the high-frequency antenna are illustrated for a point in time, said field lines being enclosed within the field backflow spaces 46 and 48 through the ring-shaped free spaces 45 and 47.

The half 22 further incorporates a disk-shaped area 30, in which are arranged conductors of the shielding coils belonging to the gradient coils. The remaining area of the half 22 is available inter alia for accommodating components of a shim system and/or a cooling system of the generator. In particular, a stem-shaped area 38 and a ring-shaped area 39 of the remaining area are used to carry supply lines to the conductors of the gradient coils, said conductors being arranged in the disk-shaped area 35 and in the ring-shaped area 36, and also to components of the cooling system arranged therein, without the need for high-frequency ducts. Otherwise FIG. 2 is as described for FIG. 1.

Figure 3:
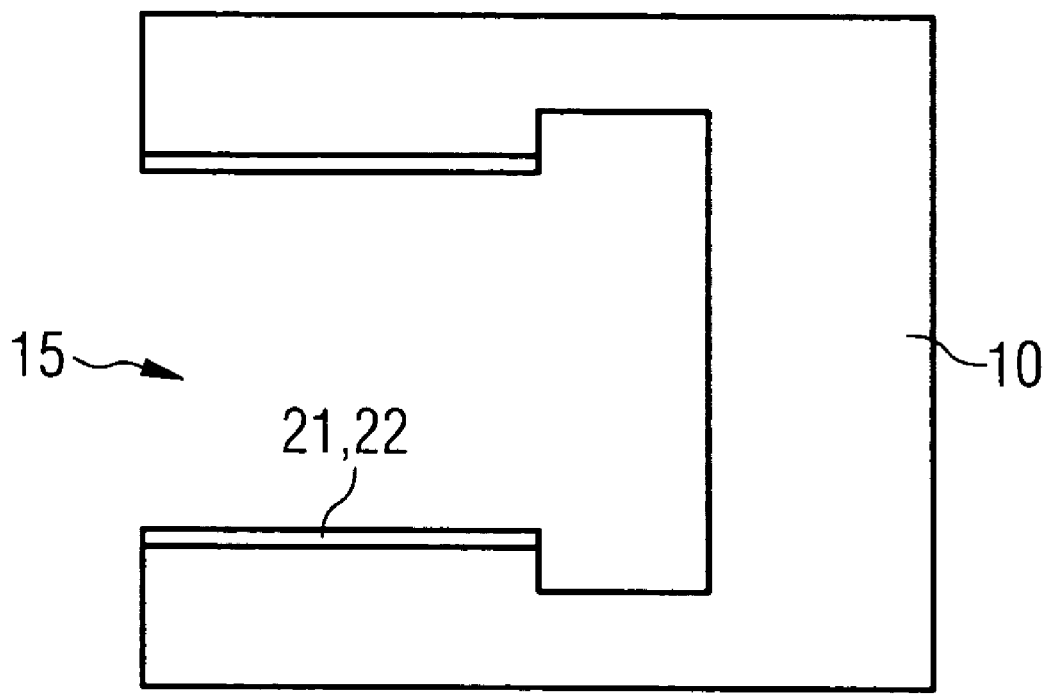
FIG. 3 shows a magnetic resonance apparatus with the generator from FIG. 1 or 2.

Finally, FIG. 3 shows the magnetic resonance apparatus with the C-shaped basic field magnet 10, to which one of the generators shown in FIGS. 1 and 2 is fixed. In this diagram the aperture of the C-shape forms the examination area 15 for imaging of at least one area of an examination subject to be examined.

Of course, the apparatus described in the exemplary embodiments can also be used accordingly on gradient coil systems without shielding coils and which are not actively shielded, as well as on generators with other basic geometry, for example circular (e.g. oval-shaped) and rectangular.

The invention claimed is:

1. A magnetic resonance device, comprising:
   an examination space for accommodating at least a portion of a subject to be examined; and
   a generator for generating time-variable magnetic fields, the generator comprising:
   a gradient coil arrangement having a plurality of first conductors extending within a first area formed as a plate, the first area having a first sub-area free of the first conductors;
   a second area within which a magnetic field backflow occurs, the second area extending from the first sub-area in a direction away from the examination space; and
   a plurality of second conductors arranged within the first sub-area operatively connected to a high-frequency antenna of the generator.

2. A generator for generating time-variable magnetic fields of a magnetic resonance device having an examination space for accommodating at least a portion of a subject to be examined, comprising:
   a gradient coil arrangement having a plurality of first conductors extending within a first area formed as a plate, the first area having a first sub-area free of the first conductors;
   a second area within which a magnetic field backflow occurs, the second area extending from the first sub-area in a direction away from the examination space; and
   a plurality of second conductors arranged within the first sub-area operatively connected to a high-frequency antenna of the generator.

3. The generator according to claim 2, wherein the second area includes a field generated by the high-frequency antenna.

4. The generator according to claim 2, wherein the second area comprises an undercut relative to the first sub-area.

5. The generator according to claim 2, further comprising a first high-frequency shield electro-magnetically shielding the first area but not the first sub-area, the first high-frequency shield extending in a direction from the first area to the examination space.

6. The generator according to claims 2, wherein a plurality of boundary surfaces of the first sub-area and the second area are electro-magnetically shielded by a second high-frequency shield.

7. The generator according to claim 2, further comprising a plurality of third conductors of a shielding coil arrangement assigned to the gradient coil arrangement, the third conductors arranged beyond the second area and extending away from the examination space.

8. The generator according to claim 2, wherein the first area is geometrically formed as a disc.

9. The generator according to claims 2, further comprising a second sub-area and a third area for magnetic field backflow.

10. The generator according to claim 9, wherein the first and second sub-areas are separated by the first conductors.

11. The generator according to claim 9, wherein the second and third areas are separate units.

12. The generator according to claim 9, wherein the first and second sub-areas are arranged concentrically.

13. The generator according to claim 2, wherein the first sub-area is geometrically formed as a ring.

14. The generator according to claim 9, wherein the second sub-area is geometrically formed as a ring.

15. The generator according to claim 13, wherein the second conductors comprise a plurality of poles for bridging the first sub-area, the poles extending radially relative to a center of the first sub-area.

16. The generator according to claim 14, wherein the second conductors comprise a plurality of poles for bridging the second sub-area, the poles extending radially relative to a center of the second sub-area.

* * * * *